United States Patent [19]
Leroux et al.

[11] Patent Number: 5,902,703
[45] Date of Patent: *May 11, 1999

[54] METHOD FOR MEASURING DIMENSIONAL ANOMALIES IN PHOTOLITHOGRAPHED INTEGRATED CIRCUITS USING OVERLAY METROLOGY, AND MASKS THEREFOR

[75] Inventors: Pierre Leroux, San Antonio, Tex.; Sethi Satyendra, San Jose, Calif.; David Ziger, San Antonio, Tex.

[73] Assignee: VLSI Technology, Inc., San Jose, Calif.

[*] Notice: This patent is subject to a terminal disclaimer.

[21] Appl. No.: 08/826,482

[22] Filed: Mar. 27, 1997

[51] Int. Cl.$^6$ .................................................. G03F 9/00
[52] U.S. Cl. ............................. 430/5; 430/22; 430/394; 356/373; 356/375; 356/383; 356/384
[58] Field of Search .................................. 430/5, 22, 394; 356/373, 375, 383, 384

[56] References Cited

U.S. PATENT DOCUMENTS

| | | | |
|---|---|---|---|
| 5,328,807 | 7/1994 | Tanaka et al. | 430/311 |
| 5,439,765 | 8/1995 | Nozue | 430/5 |
| 5,447,810 | 9/1995 | Chen et al. | 430/5 |
| 5,700,602 | 12/1997 | Dao et al. | 430/5 |
| 5,731,109 | 3/1998 | Hwang | 430/5 |
| 5,798,195 | 8/1998 | Nishi | 430/22 |
| 5,800,951 | 9/1998 | Hashimoto | 430/5 |

*Primary Examiner*—Nam Nguyen
*Assistant Examiner*—Steven H. VerSteeg
*Attorney, Agent, or Firm*—Flehr Hohbach Test Albritton & Herbert LLP

[57] ABSTRACT

Line shortening and other defects in integrated circuits are measured by imprinting accuracy determinative patterns in the scribe lines or die margins of the mask field. The patterns are ideally formed in the general nature of the usual box in a box configuration with one of the boxes being specially configured to include a series of lines and spaces having narrow widths comparable to the width of the lines to be formed in the integrated circuit. The use of the narrow lines provides the box in a box configuration with the same line shortening that the circuit feature will itself experience. Small spaces between the lines permit the standard measuring equipment to locate at the ends of the lines.

22 Claims, 3 Drawing Sheets

METHOD FOR MEASURING DIMENSIONAL ANOMALIES IN PHOTOLITHOGRAPHED INTEGRATED CIRCUITS USING OVERLAY METROLOGY, AND MASKS THEREFOR

FIELD OF THE INVENTION

This invention relates generally to the field of fabricating integrated circuits and more particularly to maintaining accuracy in the fabrication of such circuits having relatively long and extremely narrow line elements such as gates. The invention is also directed to the verification of stepper lens fabrication quality.

BACKGROUND OF THE INVENTION

In the manufacture of integrated circuits each element is ordinarily produced by a lithographic process wherein an image of one or several of the individual circuit elements or features is projected onto the wafer at a time. Because of the small size of such elements and the importance of their being accurately sized and positioned, the fabrication equipment is frequently checked for a number of possible dimensional anomalies and aberrations. These checks include "best focus" at the center of the lens for both the x and y directions as well as the "best focus" at a number of locations displaced from the center, again for both the x and y directions. Likewise, it is checked for coma (comatic aberration) and other aberrations. Such aberrations are well known in the art. See, for instance, E. HECHT, OPTICS (2d ed. reprinted with corrections 1990) p.223 or OPTICAL SOCIETY of AMERICA, HANDBOOK OF OPTICS Vol. II (2d ed. 1995) Chapter 1.

The usual way at the present time for making such checks and measuring discrepancies is with a traditional box in a box configuration having an outside box of about 20 $\mu$m square defined by a line or trench and a centrally disposed inside box of about 10 $\mu$m square similarly defined by a line or trench. Sometimes, one of the boxes is formed as a solid square rather than merely a line configuration. Moreover, the boxes need not be limited to clear tone patterns but could be formed of a dark tone. In any case the square in a square configuration utilizes a measurement between edges of the two squares. Such measurements can be taken with the aid of a scanning electronic microscope (SEM) and can be very accurate when measuring relatively large areas or verifying the position and dimensions of relatively large features. Even so, they may be quite time consuming since only about 40 individual measurements can be completed per hour.

Not all features of integrated circuits are in the relatively large category. In many instances, some of the individual features of the circuit, such as the gate lines, have extremely small dimensions and may have widths of less than 0.2 $\mu$m to 0.4 $\mu$m with their lengths being considerably greater, perhaps 0.8 $\mu$m to 2.0 $\mu$m. When dimensions reach such small size there is a tendency for the formed line to be shorter than its design length as defined by the mask. Such "line shortening", as the term is used herein, occurs when a line is particularly thin because the light passed through the mask to define the periphery of the line, while relatively constant along the length of the line, is amplified at each end of the line due to the fact that the end of the line is subjected not only to the light along the two sides but also the light at the end of the line. The shortening effect is increased when the projection is out of focus, thereby causing more light scatter. Consequently, the focus throughout the entire field of the projection must be considered. In addition the length of the line may be reduced by coma and this aberration is also carefully monitored. In such cases, the accuracy of the lens projecting light through the particular mask to create the features becomes extremely important.

When the feature is in the form of a long thin line, the usual box in a box system does not accurately measure the length of the line. Rather, it merely measures the distances between the walls of the two boxes thereby ignoring any line shortening. Moreover, measurements of the feature with an SEM is impractical because, in order to place the entire line in the measurement screen, only a very low magnification of about 10K to 20K can be employed. At such magnification the precision is only in the order to 20–25 nm.

Even though the projection of the entire mask onto the wafer has a usual dimension of less than 20 mm square, variations of the lens parameters over that small area can be critical. The slightest aberration in the lens projection can cause errors in the construction of the individual elements such as a fatal reduction in the length of the gate line known as "gate shortening". Thus, it is intended that the focus of the lens lies in a single plane and, if there is any variation from that single plane, it has to be identified so that corrections can be applied. This is important not only for the center of the lens, but for various points throughout the projection area. The same is true for other lens aberrations such as coma which can intensify the reduction in line length.

SUMMARY OF THE INVENTION

In accordance with the invention, line shortening and other defects are measured, not directly, but by imprinting accuracy determinative patterns in the scribe lines or die margins of the mask field. The patterns are ideally formed in the general nature of the usual box in a box configuration, the outer box having a dimension of 20 $\mu$m square and the inner box having a dimension of 10 $\mu$m square together defining a square ring having a distance of 5 $\mu$m between the two boxes. In addition, one of the boxes is specially configured as described hereinafter.

The invention recognizes the fact that, in photolithography, a very narrow line is produced on a resist with a length somewhat shorter than the actual length of the opening in the mask. Thus, the line width for the measurement in the invention is comparable to the line width of the gate material to be formed. In this manner instead of the standard box in a box wherein the distance between broad edges is measured, at least one of the sides includes a series of lines and spaces having widths comparable to the width of the gate lines to be formed such as 0.20 $\mu$m or 0.40 $\mu$m. Preferably, two adjacent sides of the box have such lines and spaces so that measurements can be made in both x and y directions with the same box. In addition, instead of a pattern of lines and spaces, a pattern of pillars (that is, small squares having sides of 0.20 $\mu$m or 0.40 $\mu$m with spaces between them of the same or an even lesser dimension) may be used.

The use of the narrow lines provides the box in a box configuration with the same line shortening that the circuit feature will itself experience. The equally small spaces between the lines permit the standard measuring equipment to locate the ends of the lines. When a pillar configuration is used, even narrower spacing may be required in some instances to adjust to the fact that the dimensions are small in both the x and the y directions.

Generally, the distance between solid edges of the two boxes is measured and the distance between edges, at least one of which is formed by the ends of a line and space pattern, is also measured. In such a fashion the first measurement will reflect the distance with substantial accuracy compared with the mask dimension whereas the second measurement will show the discrepancy between the mask dimension and the actual projected dimension. As will be seen hereinafter this measurement comparison can be made not only for line shortening, but also for both horizontal and vertical aberrations of focus, right coma and left coma.

BRIEF DESCRIPTION OF THE DRAWINGS

Additional objects and features of the invention will be more readily apparent from the following detailed description and appended claims when taken in conjunction with the drawing, in which:

FIG. 4 is a schematic plan view of a line and space test pattern used in accordance with the invention for measuring line shortening;

FIG. 5 is a schematic plan view of a line and space test pattern used in accordance with the invention for measuring right coma;

FIG. 6 is a schematic plan view of a line and space test pattern used in accordance with the invention for measuring left coma;

FIG. 7 is a schematic plan view of a pillar test pattern used in accordance with the invention for measuring focus;

DESCRIPTION OF THE PREFERRED EMBODIMENTS

Figure 1:
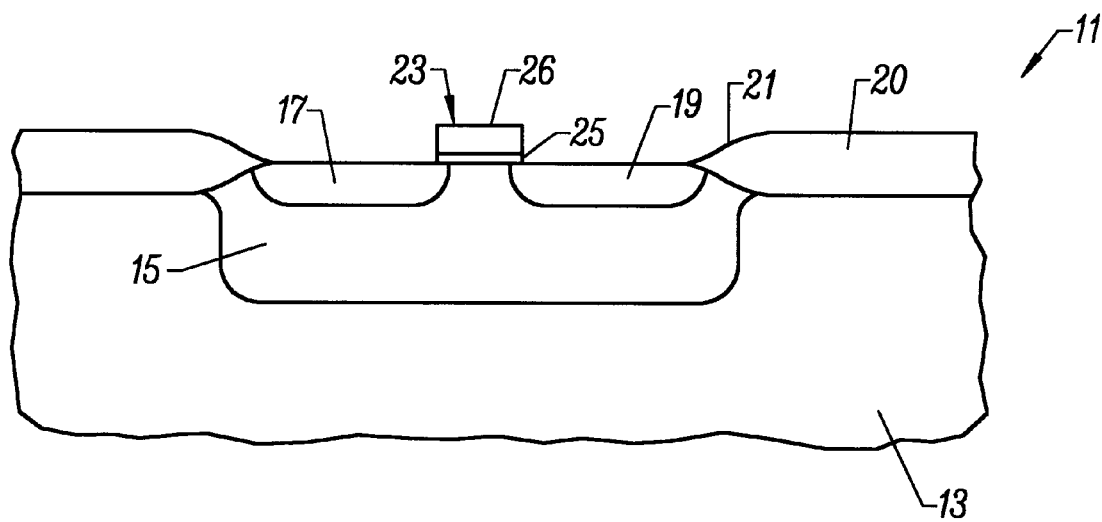
FIG. 1 is a cross sectional view showing a portion of a typical integrated circuit element of the type which will benefit from the method and procedures of the present invention.
Figure 2:
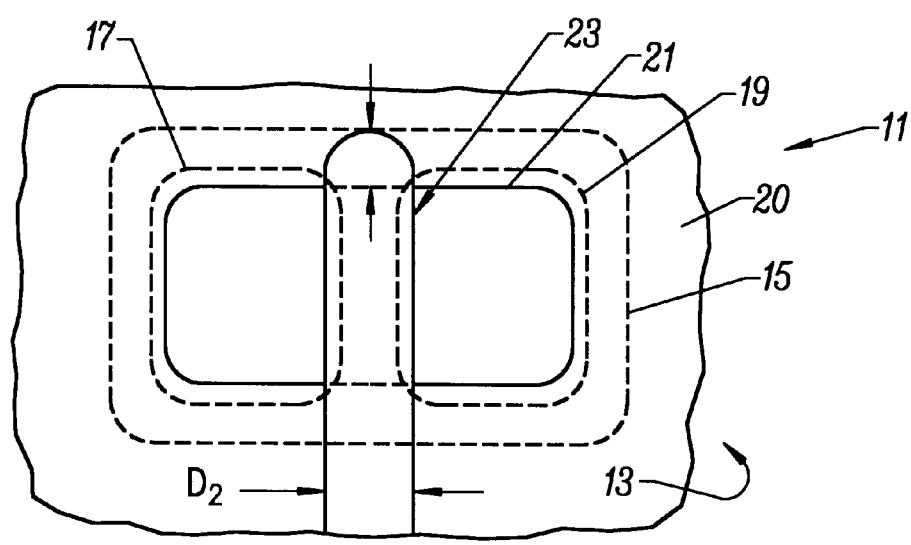
FIG. 2 is a plan view of the integrated circuit element shown in FIG. 1.

Referring to FIG. 1 there is shown a portion of a semiconductor wafer 11 which, for instance, may include an n-type substrate 13 having a p-type well 15 and n+ implants 17 and 19. During the formation of the well 15 a bird beak 21 is formed in the field oxide 20. A gate 23 is formed with a gate oxide 25 and polysilicon 26 bridging the gap between the implants 17 and 19. In devices of this type, it is important that the overlap of the gate 23 onto the field oxide 20 be as short as possible but, of course, it is necessary that the gate actually end on the field oxide 20 rather than in the diffusion layer lying below. In other words, the polysilicon of the gate should contact the field oxide 20, but just barely contact it. Ideally, this overlap of the gate on the field oxide 20 should be in the neighborhood of 0.1 $\mu$m±0.03 $\mu$m. Moreover, the extension of the gate over the active regions represented by the implants 17 and 19 in FIGS. 1 and 2 should also be in the neighborhood of 0.1 $\mu$m±0.06 $\mu$m. Thus it is seen that the dimensions of the gate 23 are very critical in producing substantial yields of high quality devices.

Figure 3:
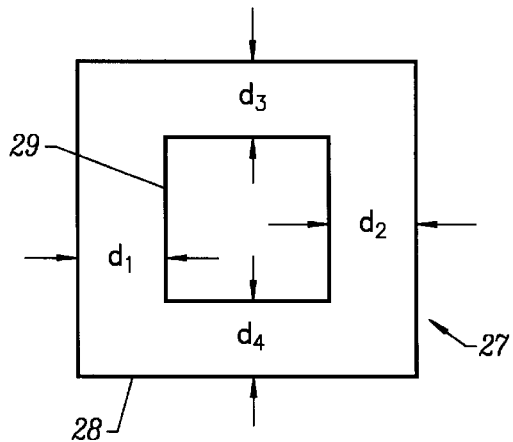
FIG. 3 is a schematic plan view of a standard box in a box pattern useful for calibration purposes.

Referring now to FIG. 3, there is shown, in schematic form, a standard box in a box pattern 27 which can be used as a calibration pattern. The pattern 27 includes the usual large square 28 with a small square 29 centrally disposed within the large square. The large square is ordinarily 20 $\mu$m on each side while the inner square is 10 $\mu$m on each side creating 5 $\mu$m spaces $d_1$, $d_2$, $d_3$ and $d_4$ between them. Since the large and small squares of the calibration pattern 27 are formed of solid lines, wide edges are provided against which the measurements of $d_1$, $d_2$, $d_3$ and $d_4$ can be made. Because of these wide measurement edges, there is no line shortening and the measurements will reflect the actual dimensions of the calibration pattern, keeping in mind that the actual dimensions may be less than the nominal 5 $\mu$m due to defocusing or other aberrations. Such misalignment, however, will be very minor. Thus, the pattern of FIG. 3 provides a stable reference to focus values.

Figure 4:
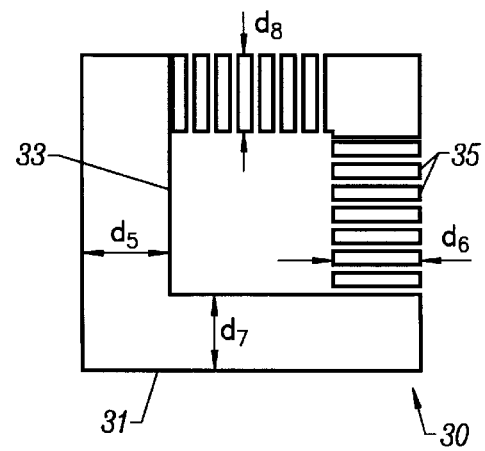
FIGS. 4 through 7 are schematic plan views showing preferred forms of test patterns used in accordance with the invention for measuring various forms of dimensional anomalies, specifically.

Referring now to FIG. 4, there is shown, in schematic form, a test pattern 30 which can be used to determine line shortening. The measurement itself will reflect both focus and line shortening but, when it is compared with measurements from the test pattern 27 of FIG. 3, the degree of line shortening alone can be determined. The test pattern 27 includes an outer box 31 and an inner box 33. Generally speaking, the outer box 31 may be 20 $\mu$m, with the inner box being 10 $\mu$m square. Thus, the distance $d_5$ between the left vertical side of the outer box and the left vertical side of the inner box is 5 $\mu$m. On the right side of the pattern, there is no solid vertical line forming wide measurement edges from which the distance $d_6$ can be measured. Rather, there is a series of parallel horizontal bars or lines 35 providing narrow measurement edges. The lines 35 each have a nominal length of 5 $\mu$m. The width of the lines 35 is selected to be the same as that of the lines of the semiconductor feature to be measured. For instance, referring to FIG. 2, if the gate 23 were to have a width $D_2$ of 0.35 $\mu$m, the width of the lines 35 in FIG. 4 would likewise be 0.35 $\mu$m. Preferably, the lines are spaced from each other by a distance equal to the width of the lines.

The test pattern 30 incorporates the dimensions as set forth above. However, when the pattern is projected onto the wafer and is photolithographed onto the wafer, the lines 35 will be shortened at both ends making the overall dimension $d_6$ of the imprinted pattern somewhat less than 5 $\mu$m. If there is any defocusing, the lines will be shortened even more.

By comparing the measurement $d_6$ with that of $d_2$, the degree of defocusing can be determined, the difference between the two being a measure of line shortening without regard to focus. Such measurements may easily be made using an overlay metrology tool such as Models 5100 or 5105 produced by KLA Instruments Corporation of Santa Clara, Calif. In making such measurements, the metrology tool recognizes the ends of the narrow horizontal lines just as it would a solid vertical side if the lines are spaced closely enough. However, its measurement will discern the line shortening and give an accurate measurement of the shortened lines.

The measurements $d_5$ and $d_6$ will provide information leading to the measurement of line shortening and focus along the horizontal axis, but a comparison of the measurements $d_7$ and $d_8$ will provide the same quantitative analysis as to vertical axis.

Figure 5:
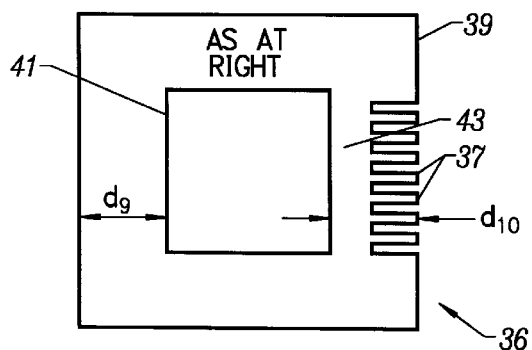

Referring now to FIG. 5, there is schematically shown a test pattern 36 used for the measurement of right coma aberration. In this instance, the test pattern 36 is the same size as the pattern 30 shown in FIG. 4 and differs from the pattern 30 only in that, instead of the lines 35, the test pattern of FIG. 5 includes shorter finger like elements 37 which extend from the right edge of the large square 39, but do not extend all the way to the small square 41. Preferably, the fingers 37 extend across half the distance between the inner and outer squares. The test pattern 36 includes a solid portion 43 extending from the inside end of the fingers 37 to the right side of the small square 41. Again, the width of the fingers 37 is comparable to the width of the lines 35 in the test pattern 30, dependent upon the size of the lines actually to be formed on the wafer.

Figure 6:
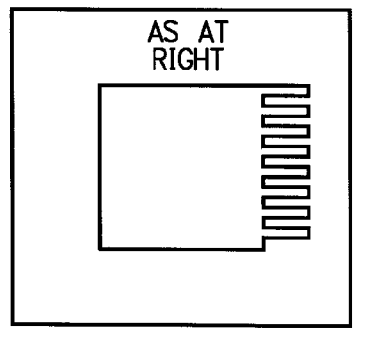

In this instance, measurement $d_9$ will again be 5 µm. The measurement $d_{10}$ will be 5 µm as measured at the mask, but, depending upon the degree of defocus, line shortening and right coma aberration, the actual measurement of $d_{10}$ as projected onto the wafer is somewhat shorter. The test pattern 44 shown in FIG. 6 is identical to the pattern 36 except that the pattern 44 measures left coma as opposed to right coma. Measurements of left coma are made in the same fashion as those for right coma. After taking the measurement $d_{10}$ for right coma and the corresponding measurement for left coma, the reduced length of lines due to coma can be determined simply by comparing the two measurements. If the measurements from the test patterns 36 are equal, there is no coma. If the measurement of the test pattern 36 is shorter, there is right coma. Conversely, if the measurement of the test pattern 44 is shorter, there is left coma. The degree of coma is determined by the difference in the measurements of the two test patterns.

Figure 7:
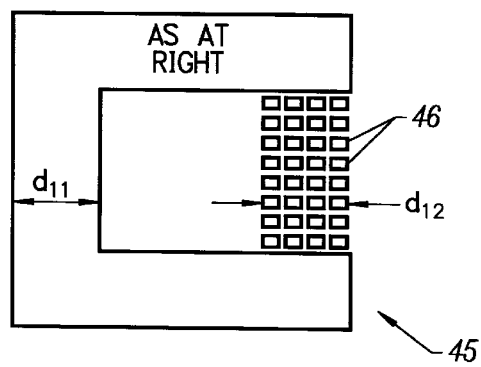

Referring now to FIG. 7, another test pattern 45 is shown suitable for measuring focus. In the pattern 45, instead of the lines of the pattern 30 or the shorter fingers of the patterns 36 and 44, the pattern includes a series of squares 46 each having a length and width determined by the width of the lines being produced on the wafer. The squares 46 may be separated from each other by distances less than their individual lengths. Thus if the gate lines 23 of FIGS. 1 and 2 have a width of 0.35 µm, the sides of each of the squares 46 should likewise be 0.35 µm. These small squares appear as microscopic towers or "pillars" since they are formed of resist material usually having a thickness three or more times greater than the side dimensions in the neighborhood of 0.2 µm to 0.4 µm.

In this instance, the measurements $d_{11}$ and $d_{12}$ are both 5 µm when considered at the mask, but when the measurement $d_{12}$ is projected onto the wafer it will be somewhat less due to the action of light around all sides of the small pillar, and thus the degree of defocusing can be even more critically determined.

Figure 8:
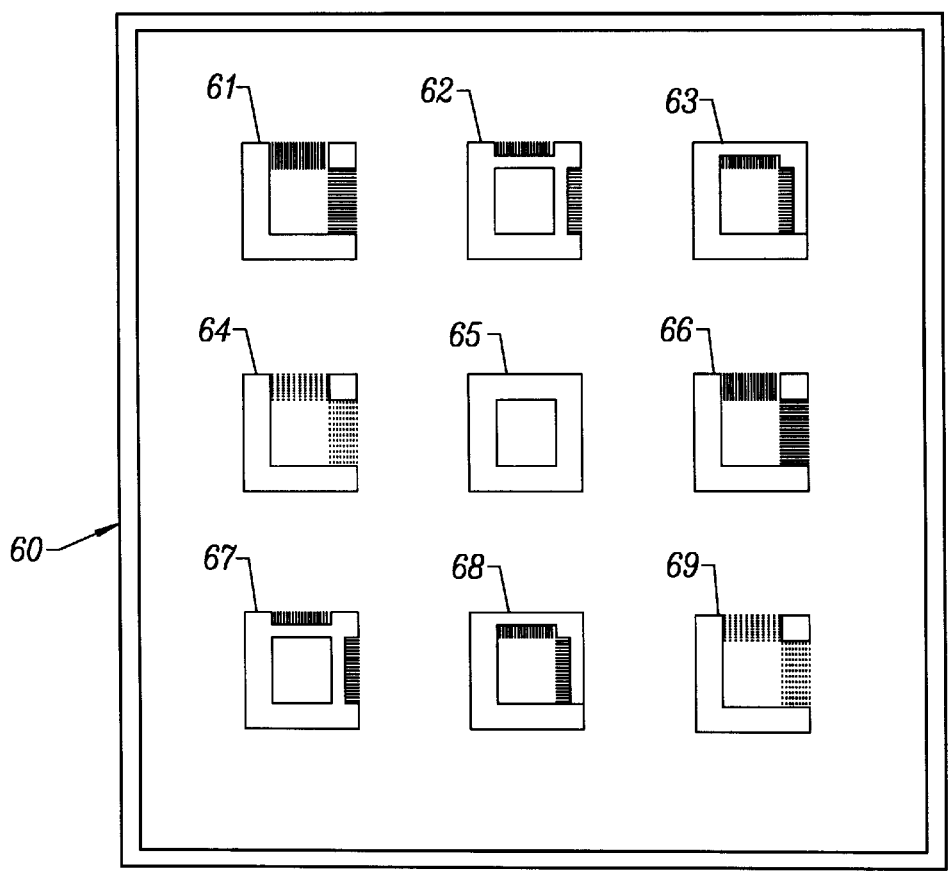
FIG. 8 is a schematic plan view showing a configuration of nine pattern boxes which may be positioned in the margin of a die as well as the margin of the projected image.

Unlike the usual use of the box in the box technology, it is not necessary in the present usage, that the large and the small boxes be imprinted separately. Rather, they can be both imprinted simultaneously since the measurement is related to the lens rather than the action of a stepper or the like. Thus a single exposure of a single mask will be sufficient. The mask can be provided not only for one of the patterns such as shown in FIGS. 3 thru 7, but a clump of such patterns may be provided as shown in FIG. 8. Referring specifically to FIG. 8, there is shown a mask 60 in accordance with the invention with nine different patterns. Patterns 61, 62, 63 and 64 may be made for use with lines having one width, such for instance, as 0.30 µm, whereas patterns 66 thru 69 may be used with a thicker line such as 0.35 µm. The patterns 61 and 66 are similar to the pattern of FIG. 4 and suitable for the measurement of focus; patterns 62 and 67 are for measuring right coma; patterns 63 and 68 are for measuring left coma; and patterns 64 and 69 are pillar patterns for more critical measure of focus. The central pattern 65 is a standard box in a box used for calibration purposes.

The entire clump of patterns as shown in FIG. 8 can be imprinted at several locations in the margins of the die and in those instances where multiple dies are printed in a single shot, at several locations in the boarders between those dies. Each clump of patterns at the several locations will include test patterns 30 as shown in FIG. 4 and, at each of these sites, multiple measurements of the distances $d_5$ and $d_6$ are made at different degrees of defocus and at nominal focus. These measurements can be used to determine the amount of line shortening and the amount of correction required. For each site, curves can then be plotted to reflect the degree of misregistration for each focus setting. With the information as to the degree of misregistration at various sites on the mask, corrective measures may be taken such as tilting the table carrying the wafer or by adjusting the circuit mask itself with Optical Proximity Correction (OPC).

Likewise, the test patterns 27, 36, 44 and 45 of FIGS. 3, 5, 6 and 7 are also replicated at each of the various sites, and the corresponding measurements of those patterns are made at different degrees of defocus and at nominal focus. These measurements can be used to determine the amount of left and right coma as well as a more critical defocus determination. Again, the measurements may be used to determine the amount of correction required. For each site, curves can then be plotted to reflect the degree of misregistration for each focus setting.

Figure 9:
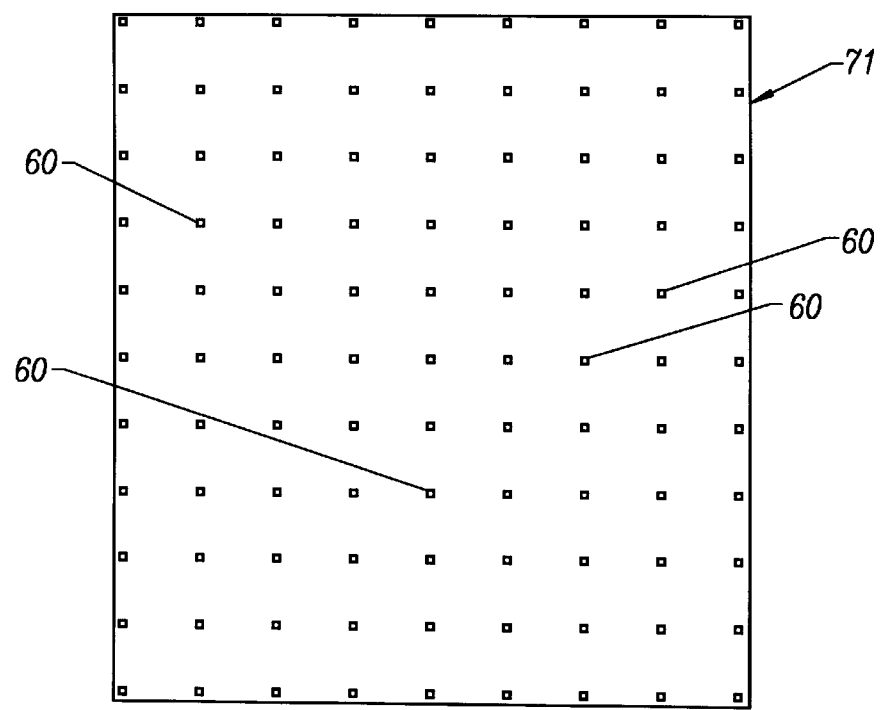
FIG. 9 is a schematic plan view of a complete die projection which may utilize multiple repetitions of the group of pattern boxes shown in FIG. 8 and which may be used to calibrate the optics of the system.

While the discussion hereinabove has been with respect to a series of patterns to be used with the masks while printing the actual circuits onto the wafer, a series of such patterns can be used as an overall mask for testing and adjusting a lens in its entirety. Such an arrangement is shown in FIG. 9 wherein the entire mask 71 measuring 20 mm×25 mm includes numerous patterns 60 as the type shown in FIG. 8. With such an arrangement, the operation of the lens throughout its entire projection area can be measured for all of the aforementioned aberrations.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For instance, references herein have been to clear tone patterns but dark tone patterns are also envisioned. In addition, reference has been made to box in a box configuration but the only essential is that markings suitable for measurement by the metrology tool be provided with the conformations indicative of the features to be defined.

We claim:

1. A method of measuring dimensional anomalies in the formation of circuit features on a semiconductor wafer comprising:

photolithographing a calibration pattern onto a wafer;
said calibration pattern having a nominal first given length the ends of which being defined by measurement edges having widths sufficient to effectively preclude line shortening;

photolithographing a test pattern onto a wafer;
said test pattern having a nominal second given length at least one of the ends of which being defined by a measurement edges having a width comparable to the width of said circuit features; and measuring the lengths of said calibration pattern and said test pattern as photolithographed onto said wafer.

2. The method of measuring dimensional anomalies in the formation of circuit features on a semiconductor wafer as described in claim 1 wherein said first and said second given lengths are equal.

3. The method of measuring dimensional anomalies in the formation of circuit features on a semiconductor wafer as described in claim 1 wherein said test pattern includes a series of parallel lines.

4. The method of measuring dimensional anomalies in the formation of circuit features on a semiconductor wafer as described in claim 3 wherein said parallel lines are spaced from each other by a distance equal to the width of said lines.

5. The method of measuring dimensional anomalies in the formation of circuit features on a semiconductor wafer as described in claim 3 wherein said test pattern includes a measurement edge at one end of said second given length having a width sufficient to effectively preclude line shorteng and a measurement edge at the other end of said second given length having a width comparable to the widths of said circuit features.

6. The method of measuring dimensional anomalies in the formation of circuit features on a semiconductor wafer as described in claim 5 wherein said series of parallel lines extends for one half of said second given length.

7. The method of measuring dimensional anomalies in the formation of circuit features on a semiconductor wafer as described in claim 1 wherein said test pattern includes a pillar pattern including an array of pillar elements each of which has an individual length equal to its width.

8. The method of measuring dimensional anomalies in the formation of circuit features on a semiconductor wafer as described in claim 7 wherein said individual pillars are spaced from each other by a distance less than their individual lengths.

9. The method of measuring dimensional anomalies in the formation of circuit features on a semiconductor wafer as described in claim 1 wherein both ends of said test pattern having a nominal second given length are defined by measurement edges having widths comparable to the width of said circuit features.

10. A method of measuring the effects of aberrations in the formation of features on a wafer comprising:

forming a mask having a first box of a first dimension and a second box having a smaller dimension, said second box being symmetrically disposed within the first box;

a series of fingers disposed adjacent at least one side of said small box;

photolithographing said mask pattern onto a wafer;

measuring the distance between linear sides of said first and second boxes as photolithographed onto said wafer and measuring the distance between one side of one of said boxes and the ends of said fingers as photolithographed onto said wafer.

11. A mask for measuring dimensional anomalies in the formation of circuit features on a semiconductor wafer with a stepper lens comprising:

a calibration pattern having a nominal first given length the ends of which being defined by measurement edges having widths sufficient to effectively preclude line shortening by said stepper lens; and a test pattern having a nominal second given length at least one of the ends of which being defined by a measurement edge having a width comparable to the width of said circuit features and subject to line shortening by said stepper lens.

12. The mask for measuring dimensional anomalies in the formation of circuit features on a semiconductor wafer as described in claim 11 wherein said first and said second given lengths are equal.

13. The mask for measuring dimensional anomalies in the formation of circuit features on a semiconductor wafer as described in claim 11 wherein said test pattern includes a series of parallel lines.

14. The mask for measuring dimensional anomalies in the formation of circuit features on a semiconductor wafer as described in claim 13 herein said parallel lines are spaced from each other by a distance equal to the width of said lines.

15. The mask for measuring dimensional anomalies in the formation of circuit features on a semiconductor wafer as described in claim 13 wherein said test pattern includes a measurement edge at one end of said second given length having a width sufficient to effectively preclude line shortening and a measurement edge at the other end of said second given length having a width comparable to the width of said circuit features.

16. The mask for measuring dimensional anomalies in the formation of circuit features on a semiconductor wafer as described in claim 15 wherein said series of parallel lines extends for one half of said second given length.

17. The mask for measuring dimensional anomalies in the formation of circuit features on a semiconductor wafer as described in claim 11 wherein said test pattern includes a pillar pattern including an array of pillar elements each of which has an individual length equal to its width.

18. The mask for measuring dimensional anomalies in the formation of circuit features on a semiconductor wafer as described in claim 17 wherein said individual pillars are spaced from each other by a distance less than their individual lengths.

19. The mask for measuring dimensional anomalies in the formation of circuit features on a semiconductor wafer as described in claim 11 wherein both ends of said test pattern having a nominal second given length are defined by measurement edges having widths comparable to the widths of said circuit features.

20. A mask for verifying stepper lens fabrication quality for a stepper used in the fabrication of integrated circuits having circuit features, said mask comprising:

an array of pattern clumps disposed throughout the area of the mask;

each of said pattern clumps including;

a calibration pattern having a nominal first given length the ends of which being defined by measurement edges having widths sufficient to effectively preclude line shortening by said stepper lens; and a test pattern having a nominal second given length at least one of the ends of which being defined by a measurement edge having a width comparable to the width of said circuit features and subject to line shortening by said stepper lens.

21. A mask for verifying stepper lens fabrication quality as defined in claim 20 wherein each of said pattern clumps includes a test pattern including a series of parallel lines; said parallel lines having a measurement edge at one end of said second given length sufficiently wide to effectively preclude line shortening and a measurement edge at the other end of said second given length having a width comparable to the width of said circuit features.

22. A mask for verifying stepper lens fabrication quality as defined in claim 20 wherein both ends of said test pattern having a nominal second given length are defined by measurement edges having widths comparable to the width of said circuit features.

* * * * *